United States Patent [19]

Ito et al.

[11] Patent Number: 5,038,190
[45] Date of Patent: Aug. 6, 1991

[54] PHOTOELECTRIC CONVERSION DEVICE WITH DISABLED ELECTRODE

[75] Inventors: Hisao Ito; Yoshihiko Sakai; Masato Takinami, all of Kanagawa, Japan

[73] Assignee: Fuji Xerox Co., Ltd., Tokyo, Japan

[21] Appl. No.: 420,829

[22] Filed: Oct. 12, 1989

[30] Foreign Application Priority Data

Oct. 13, 1988 [JP] Japan .................. 63-258058

[51] Int. Cl.⁵ .............................. H01L 27/14
[52] U.S. Cl. ........................... 357/30; 357/2; 357/15; 357/32; 357/59; 357/4
[58] Field of Search .......... 357/30 K, 30 C, 30 H, 357/30 Q, 15, 32, 2, 59 D, 4

[56] References Cited

U.S. PATENT DOCUMENTS

| | | | |
|---|---|---|---|
| 4,698,495 | 10/1987 | Kajiwara | 357/30 Q |
| 4,764,682 | 8/1988 | Swartz | 357/30 H X |
| 4,791,466 | 12/1988 | Kato | 357/30 H |
| 4,811,069 | 3/1989 | Kakinuma et al. | 357/30 C |

FOREIGN PATENT DOCUMENTS

| | | | |
|---|---|---|---|
| 61-281550 | 12/1986 | Japan | 357/30 Q |
| 61-284957 | 12/1986 | Japan | 357/30 Q |
| 62-33452 | 2/1987 | Japan | 357/30 H |

*Primary Examiner*—William Mintel
*Attorney, Agent, or Firm*—Finnegan, Henderson, Farabow, Garrett, and Dunner

[57] ABSTRACT

A device for photoelectric conversion and a process for fabricating the device are provided. The device exhibits superior dark current characteristics, and therefore a superior contrast ratio. The device is arranged to reduce or eliminate the vertical component of an electric field under an area where an ohmic contact, rather than a Schottky barrier, exists. The device can be fabricated using process equipment that sputters one or more of the device layers, including the wiring metal.

15 Claims, 4 Drawing Sheets

PHOTOELECTRIC CONVERSION DEVICE WITH DISABLED ELECTRODE

BACKGROUND OF THE INVENTION

1. Field of the Invention

This invention relates to a general purpose photoelectric conversion device having one or more cells, and particularly to such a device for use in an image input stage of a facsimile apparatus.

2. Prior Art

A recent trend in the art of facsimile apparatus design involves a contact type image sensor provided with a reading device, having a long dimension equal to the width of manuscript paper. This type of sensor is employed in an image input stage of a facsimile apparatus and has the advantage that it can be miniaturized and can avoid the use of a reducing optical system.

This contact type image sensor employs an amorphous silicon hydride (a-Si:H) semiconductor as a photoelectric conversion layer. Photoelectric conversion cells having a sandwich structure, in which a photoelectric conversion layer is disposed between metal and transparent electrodes, are arranged in the image sensor of this type. Thus, this contact type image sensor has a simple structure and good photoelectric conversion characteristics.

FIG. 5 shows a cross-sectional view of a conventional sensor. In this figure, reference numeral 1 denotes an insulating substrate; 2 a metal electrode; 3 a semiconductor layer; 4 a transparent electrode; 5 a transparent insulating film; 5a an open portion of the transparent insulating film; and 6 wiring metal.

In the conventional photoelectric conversion device, a metal electrode film 2, of approximately 1000 Å thickness, made of a metal such as chromium is formed on a glass substrate 1 by using a sputtering technique. By going through a patterning process, the film is formed into the metal electrode 2 as a common electrode and shaped like a band, typically spanning all of the reading cells of an array, which array would extend linearly in the vertical direction in FIG. 1(a).

Then, by performing a plasma-assisted chemical vapor deposition (CVD) technique, the photo-responsive semiconductor layer 3 made of amorphous silicon hydride, of 1 μm film thickness, is formed by using silane (SiH4) gas on condition that the flow rate thereof is 20-50 SCCM; the pressure thereof 0.2-0.5 Torr; the temperature of the substrate 150°-250° C.; RF power 10-50 mW/cm$^2$; and elapsed time 30-60 minutes.

Subsequently, a transparent electrode layer 4 of 800 Å thickness is formed, by using DC magnetron sputtering, of tin indium oxide. Furthermore, a resist is coated on this layer and then, by going through a patterning process employing a photoetching method, a transparent electrode 4 is formed for each individual reading cell.

The semiconductor layer 3 is etched using this patterned resist as a mask, by a mixed gas composed of tetrafluoromethane and oxygen, so that an individual semiconductor layer 3 is formed for each cell. After the resist is removed, a transparent insulating film 5 is formed by a coating technique; and the open portion 5a for connecting the wiring metal 6 thereto is made by a patterning technique. Each separate photoelectric conversion cell (reading element) is made by connecting the wiring metal 6 to the transparent electrode 4 through the open portion 5a (see, for example, Japanese Patent Application Provisional Publication No. 63-7772 Official Gazette).

One might expect this photoelectric conversion cell, made using the above described process, to operate as follows: When light is irradiated on the semiconductor layer 3 with the bias voltage being applied thereto through the metal electrode 2 and wiring metal 6, carriers are produced in the semiconductor layer 3 and a photoelectric current ($I_p$) is drawn through the wiring metal 6 and metal electrode 2. In contrast, when light is not irradiated thereon, the quantity of dark current should be small because a Schottky barrier exists between the semiconductor 3 and the transparent electrode 4 even with the bias voltage applied. Thus, one might expect the photoelectric conversion cell to function as an efficient photosensor.

Nevertheless, the sequence of processes for fabricating this sensor includes a process of depositing a film of metal 6, by sputtering. Because this process involves the impact of ions on the surface of the transparent electrode layer 4, aluminum atoms penetrate into the transparent electrode layer, composed of tin indium oxide, or equivalent, and further into the semiconductor layer 3 composed of amorphous silicon hydride. As a result, the Schottky barrier is insufficiently formed; and, instead, a contact similar to an ohmic contact is formed. Further, the quantity of the dark current becomes larger in proportion to the area of the open 5a. Thus, the contrast ratio (the ratio of photoresponsive current to dark current) is insufficient for the cell to function as an efficient sensor.

OBJECTS AND SUMMARY OF THE INVENTION

Therefore, a problem to be resolved by the present invention is to provide a photoelectric conversion cell having a high contrast ratio and reduced dark current, which can be fabricated using the process equipment used to fabricate the conventional sensor.

The device of the present invention reduces the dependency of the dark current on bias voltage by disabling, in each cell, a portion of the common metal electrode facing the portion of the transparent electrode connected to the wiring metal. In one specific embodiment, the present invention reduces the vertical component of the electric field under the portion of the transparent electrode where an ohmic contact is formed with the semiconductor (or the Schottky barrier is impaired), making it less likely that dark current carriers will contribute to the apparent output of each cell to which a bias voltage is supplied. Thus, the present invention reduces the quantity of the dark current because, under the connecting portion of the transparent electrode, a relatively small electric field exists in the vertical direction. This effect is achieved by providing a hole in the area of the metal electrode facing, or nearest, the wiring metal.

In another specific embodiment, the common electrode is separated into active and inactive bands; and the wiring metal is sputtered to connect over the inactive band, while still providing effective connection to the transparent electrode for the photoresponse of the active bands.

Moreover, the device of the present invention can be fabricated using process equipment, such as sputtering equipment to form an aluminum wiring portion, used to fabricate the prior art device.

In accordance with an aspect of the present invention, a photoelectric conversion device having one or more cells comprises: a photoresponsive semiconductor film; a base for the semiconductive film including a metal electrode; a transparent electrode disposed over the semiconductive film and forming a Schottky barrier therewith at least in a region opposed to at least a first portion of the metal electrode in an orthogonal direction through the semiconductor film; and means for making a sputtering connection to the transparent electrode; the cell being improved in that a portion of the metal electrode opposed to the sputtered connection in the orthogonal direction through the semiconductive film is disabled.

In accordance with another aspect of the present invention, there is provided a method for manufacturing a radiation detection device, which comprises the steps of depositing a film of metal electrode onto a glass substrate; photoetching away a certain portion of the film of metal electrode; depositing a film of semiconductor; forming a transparent electrode on the film of semiconductor; forming a masking layer, including an open portion opposing the disabled portion in the metal electrode film; and through which an area of the transparent electrode is exposed subsequently, depositing a film of interconnection metal onto the exposed area of the transparent electrode by using a sputtering technique.

Embodiments of the present invention will now be described by referring to the accompanying drawings.

BRIEF DESCRIPTION OF THE DRAWINGS

FIG. 1 illustrates a first embodiment of a photoelectric conversion device of the present invention.

FIG. 3 illustrates a second embodiment of the photoelectric conversion device of the present invention.

Figure 1A:
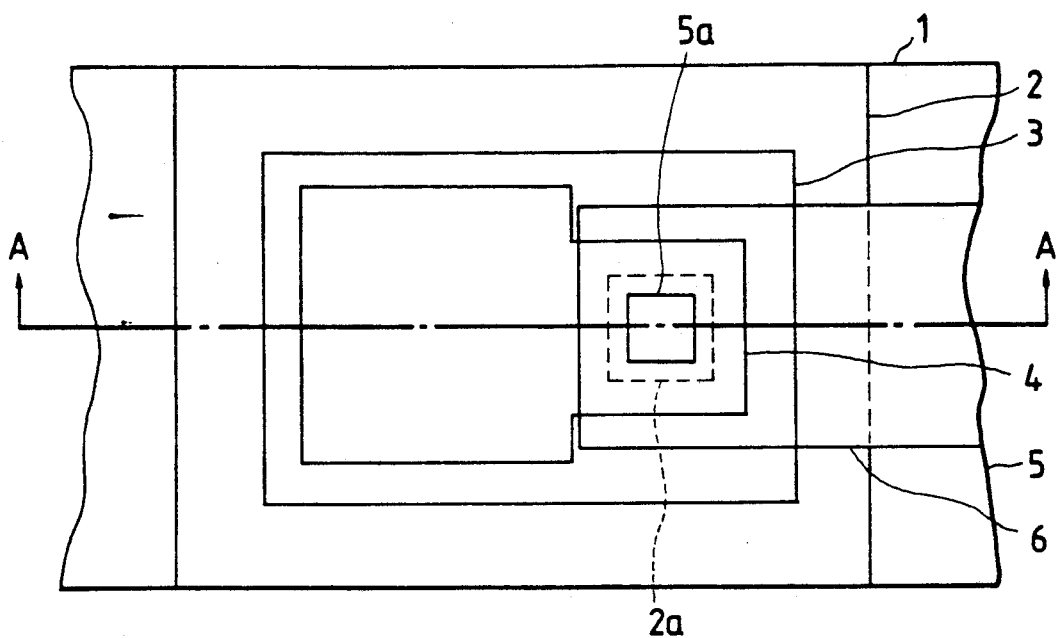
FIG. 1(a) is a plan view of a cell of the first embodiment photoelectric conversion device.

In the above described drawings, reference numeral 1 denotes an insulating substrate; 2 a metal electrode; 2a an open portion of the metal electrode; 3 a semiconductor layer; 4 a transparent electrode; 5 a transparent insulting film; 5a an open portion of the transparent insulating film; and 6 a wiring metal.

DETAILED DESCRIPTION OF THE PREFERRED EMBODIMENTS

Figure 1B:
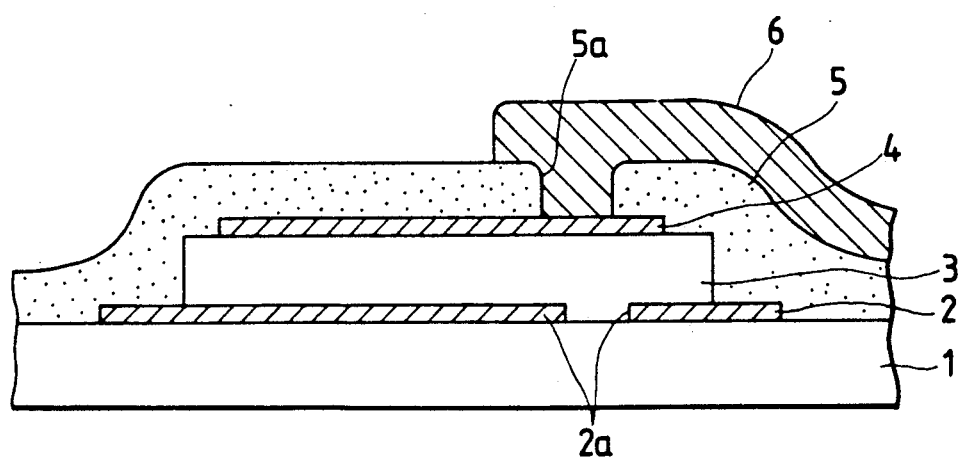
FIG. 1(b) is a cross-sectional view taken on line A—A of FIG. 1(a).
Figure 2A:
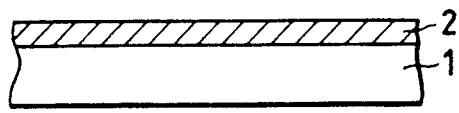
FIG. 2 illustrates the sequence of steps for fabricating a photoelectric conversion device of the present invention.
Figure 2B:
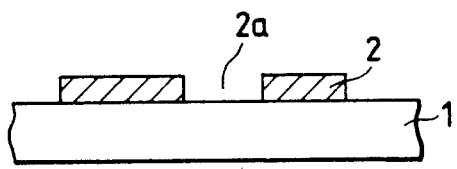

A method of fabricating a first embodiment of the present invention will now be described with reference to FIG. 1 and FIG. 2. First, as shown in FIG. 2(a), glass is used as an insulating substrate 1 and further a film of a metal electrode 2, of approximately 1000 Å thickness, is deposited on the substrate 1 by using a sputtering method. (Illustratively of chromium, but other metals such as Nichrome (NiCr), tungsten (W) and tantalum (Ta) may be used to form the metal electrode.) Thereafter, the electrode is shaped as a band as shown in FIG. 1(a) by using a photoetching method to form a common electrode. As shown in FIG. 2(b), the electrode has a pattern including, for each cell, a cutaway open portion 2a near one edge thereof to face an opening 5a of the transparent insulating film which will be formed later.

Figure 2C:
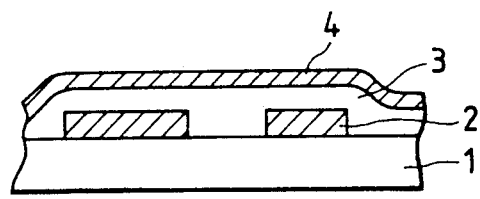

Subsequently, as shown in FIG. 2(c), by using a plasmaassisted chemical vapor deposition (CVD) method, a film made of amorphous silicon hydride, of approximately 1.5 $\mu$m thickness, is formed as a semiconductor layer 3 (it is also possible to deposit the semiconductor layer using a sputtering method). A film, of approximately 700 Å thickness, made of tin indium oxide is formed as a transparent electrode 4 on the semiconductor layer 3. (It is preferable to form the transparent electrode by effecting a plasma-assisted CVD method using tin indium oxide and tin oxide and the like.) First, the patterning of the transparent electrode layer 4 is effected by performing the photoetching process and then that of the semiconductor layer 3 is effected by performing a dry etching process using tetrafluoromethane and oxygen under normal conditions to respectively form the photo receiving portions as shown in FIG. 1(a).

Figure 2D:
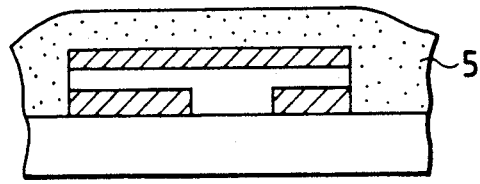
Figure 2E:
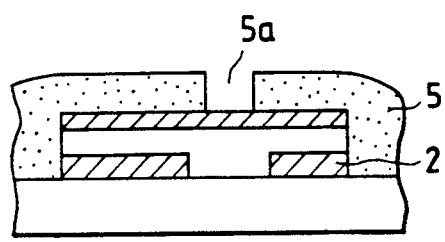

Further, as shown in FIG. 2(d), a film of polyimide, of which the thickness is about 1.5 $\mu$m, is formed as a transparent insulating layer 5 by using a coating (or sputtering) technique and then the patterning of the open portion 5a is effected to form it in the shape as shown in FIG. 1(a). At that time, a photoetching process is effected such that the size of the open portion 5a is less than that of the open portion 2a, and is directly opposed thereto in the orthogonal direction through the film 3.

Figure 2F:
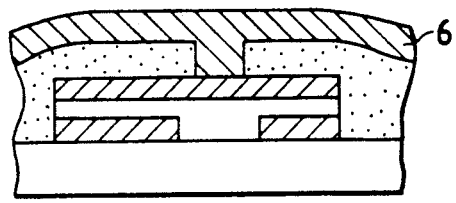
Figure 2G:
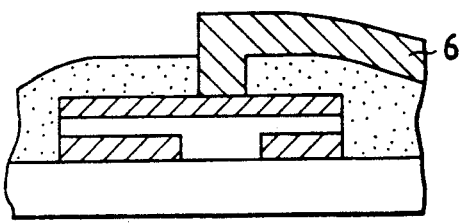

In the next step, as shown in FIG. 2(f), a film of aluminum, of which the thickness is about 1.5$\mu$, is deposited as wiring metal 6 on the transparent insulating layer by using a sputtering method. Thereafter, the wiring metal 6 is formed into the shape as shown in FIGS. 2(g), 1(a), and 1(b) by a photoetching process. It is seen that in a device constituting a plurality of cells, cells are interconnected through a common electrode 2 running in a band structure through all the cells of the array. When fabricating a multicell device, the interconnection metal 6 must be patterned after deposition so that each cell has an electrically separate connection. Thus, the first embodiment of the photoelectric conversion device of the present invention is fabricated.

Figure 3A:
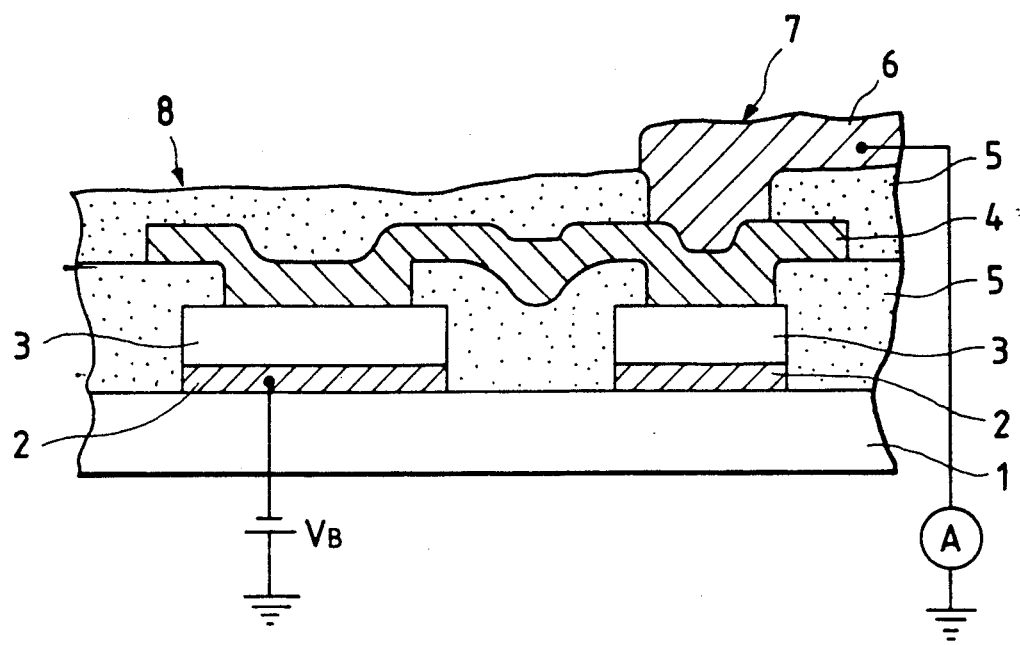
FIG. 3(a) is a cross-sectional view of a cell of this photoelectric conversion device.

A second embodiment of a photoelectric conversion device of the present invention is shown in FIG. 3. The photoelectric conversion device shown in FIG. 3(a) is fabricated to separate an inactive portion 7 of the cell and of the metal electrode 2 under the wiring metal 6 from an active portion of the metal electrode under the photo receiving (active) portion 8 in the illustrated cell in the photoelectric conversion device.

Figure 3B:
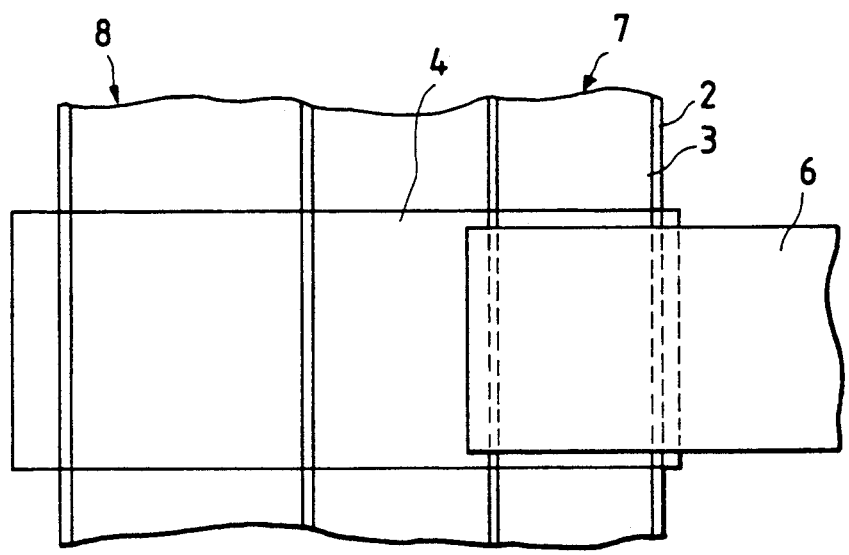
FIG. 3(b) is a plan view of a cell of this photoelectric conversion device.

As a first step of a modified fabrication method, a film of a metal electrode 2 and a film of a semiconductor 3 are sequentially deposited on the substrate 1 and then the patterning of the metal electrode 2 and the semiconductor 3 is effected to form them in the separated shapes shown in FIG. 3(b). The inactive portion 7 may be much narrower than the active portion 8 in each cell. Next, a film made of polyimide is deposited thereon as a transparent insulating layer 5. Furthermore, an opening is made through the initial insulating layer 5, where transparent electrode 4 will contact the semiconductor 3, by a photoetching process. Similar to the first embodiment shown in FIG. 1, the film 3 is made of amorphous silicon hydride; and the transparent electrode 4 and its patterning is effected to form it in the shape as shown in FIG. 3(b) (spanning the active and inactive strips of semiconductor 3 in an individual cell).

Subsequently, as in the fabrication of the first embodiment shown in FIG. 1, the transparent insulating layer 5 is formed by depositing polyimide and, further, the open portion 5a is formed by effecting a patterning process. Additionally, the film of the wiring metal 6 of approximately 1.5μ thickness, is formed by using aluminum metal in a sputtering process to form it in the shape shown in FIG. 3(b), which is an individual connection for each cell. It will be seen that the inactive portion of the metal film 2 is left unconnected (FIG. 3(a)).

In this way, the device can be fabricated such that the semiconductor and metal in the photo-receiving portion 8 are electrically isolated from the semiconductor under the connecting portion of the transparent electrode 4 connected to the wiring metal 6 in the inactive portion 7 of the cell. The metal electrode portion 2 under the photo receiving portion 8 is connected to the bias power source $V_b$. The wiring metal 6 is connected to a driving circuit portion, A, such that photoelectric current from the active cell portion can be drawn therefrom, while at the same time providing a laterally off-set connection to the transparent electrode 4.

Figure 4:
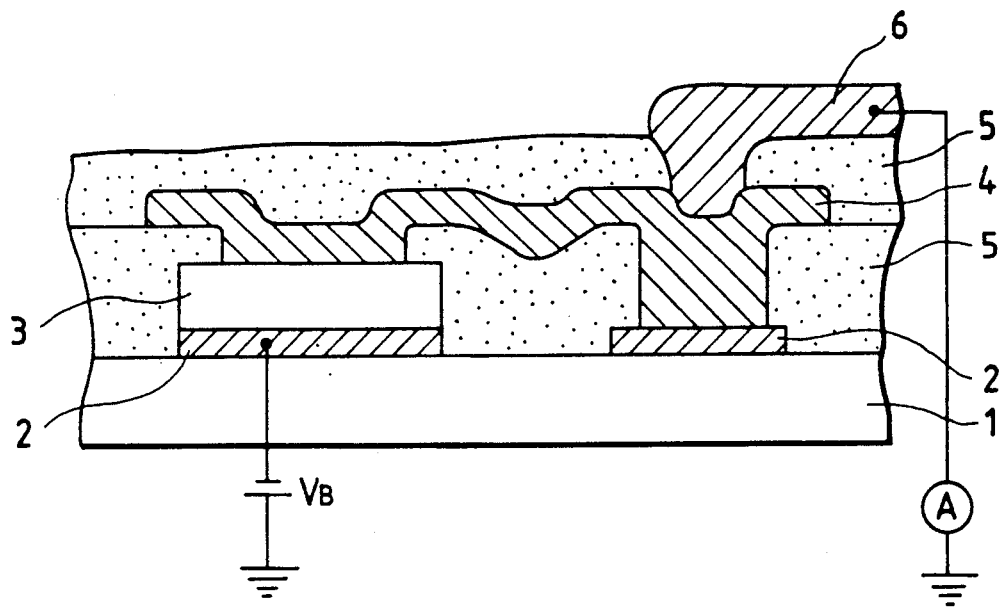
FIG. 4 illustrates a cross-sectional view of a third embodiment of the present invention.
Figure 5:
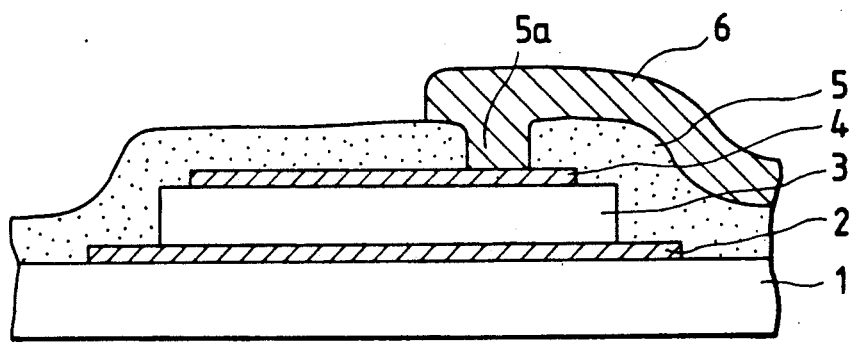
FIG. 5 is a cross-sectional view of a conventional photoelectric conversion device.

FIG. 4 illustrates a third embodiment of the present invention wherein the metal electrode 2 is first formed and the transparent electrode 4 is then formed thereon, eliminating the inactive portion of the semiconductor 3, and connected to the wiring metal 6. Alternatively, when the connecting portion of the transparent electrode is connected to the wiring metal 6, the transparent electrode layer 4 may be formed directly on the substrate 1 (not shown).

Thus, the photoelectric conversion device of the present invention reduces or eliminates the vertical component of the electric field under the connecting portion of the transparent electrode connected to the wiring metal. The metal electrode facing the connecting portion of the transparent electrode is disabled. In one embodiment of the present invention the metal electrode facing the connecting portion has an open portion. In another embodiment of the present invention the portion of the metal electrode under the connecting portion for the transparent electrode is insulated from the portion of the metal electrode to which the bias voltage is applied. Thereby, the photoelectric conversion device of the present invention, having reduced dark current and a contrast ratio sufficient for the device to function as an efficient sensor, can be fabricated using process equipment used to fabricate the conventional sensor.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or the scope of applicants' general inventive concept.

What is claimed is:

1. A photoelectric conversion device having at least one cell comprising:
   a photoresponsive semiconductive film;
   a base for the semiconductive film including a metal electrode;
   a transparent electrode disposed over the semiconductive film and forming a Schottky barrier therewith at least in a region opposed to at least a first portion of the metal electrode in a direction normal to a plane defined by a surface of the semiconductor film;
   and a sputtering connection on the transparent electrode;
   the cell being improved in that a second portion of the metal electrode opposed to the sputtered connection in the normal direction is disabled from drawing a photocurrent.

2. The photoelectric conversion device of claim 1 in which the second portion of the metal electrode is disabled in that the semiconductive film does not extend over the second portion of the metal electrode.

3. The photoelectric conversion device of claim 1 in which the second portion of the metal electrode is disabled in that the device includes means for electrically isolating the second portion of the metal electrode from the first portion of the metal electrode.

4. The photoelectric conversion device of claim 1 or claim 3 in which the disabled portion of the metal electrode is laterally offset from the semiconductive film and the transparent electrode is connected thereto.

5. A photoelectric conversion device having at least one cell comprising:
   a transparent electrode having an external side and an internal side, the external side having an area for contact with an interconnection metal and having a remaining area;
   a transparent electrode having an external side and an internal side, the external side having an area for contact with an interconnection metal and having a remaining area;
   a semiconductor layer having a first side and a second side; the first side being adjacent to the internal side of the transparent electrode; and
   a metal electrode adjacent to the second side of the semiconductor layer, capable of generating an electric field, and arranged such that the component of the electric field in a direction normal to a plane defined by the surface of the semiconductor layer under the area for contact is small relative to the component of the electric field in the normal direction under the remaining area.

6. A photoelectric conversion device as recited in claim 5 wherein in each cell the metal electrode has a hole in an area opposing the area for contact, in the normal direction through the semiconductor, on the transparent electrode.

7. a photoelectric conversion device as recited in claim 5 and further comprising in each cell an insulating layer adjacent to the external side of the transparent electrode, and having a hole corresponding to the contact area.

8. A photoelectric conversion device as set forth in claim 6, wherein the size of the hold in the metal electrode is at least 50% the size of the contact area of the transparent electrode.

9. A photoelectric conversion device as set forth in claim 7, wherein the insulating layer is made of polyimide, and the metal electrode has a hole in an area opposing the area for contact, the size of the hole in the metal electrode being at least 50% the size of the contact area of the transparent electrode.

10. A photoelectric conversion device as recited in claim 5 wherein in each cell the metal electrode is arranged such that, the portion thereof opposing the area for contact in the normal direction through the semiconductor on the transparent electrode is electrically isolated from a portion of the metal electrode to which a bias voltage is applied.

11. a photoelectric conversion device as recited in claim 10 and further comprising in each cell an insulating layer adjacent to the external side of the transparent electrode, and having a hole corresponding to the contact area.

12. A photoelectric conversion device as set forth in claim 11, wherein the insulating layer is made of polyimide.

13. A photoelectric conversion device as set forth in claim 1, wherein the metal electrode has a hold in an area opposing the area for contact, the size of the hole in the metal electrode being at least 50% the size of the contact area of the transparent electrode.

14. a photoelectric conversion device as set forth in claim 1, wherein the second portion of the metal electrode is disabled by having a hole therethrough.

15. The photoelectric conversion device of claim 14, wherein the size of the hole in the second portion of the metal electrode is at least 50% the size of the sputtering connection.

* * * * *

UNITED STATES PATENT AND TRADEMARK OFFICE
CERTIFICATE OF CORRECTION

PATENT NO. : 5,038,190
DATED : August 06, 1991
INVENTOR(S) : Hisao Ito et al.

It is certified that error appears in the above-indentified patent and that said Letters Patent is hereby corrected as shown below:

Claim 7, column 6, line 52, change "a" to --A--.

Claim 8, column 6, line 58, change "hold" to --hole--.

Claim 11, column 7, line 6, change "a" to --A--.

Claim 13, column 8, line 2, change "1" to --7--.

Claim 13, column 8, line 2, change "hold" to --hole--.

Claim 14, column 8, line 6, change "a" to --A--.

Signed and Sealed this

First Day of November, 1994

Attest:

BRUCE LEHMAN

*Attesting Officer*  *Commissioner of Patents and Trademarks*